United States Patent
Lou et al.

(10) Patent No.: US 7,643,586 B1
(45) Date of Patent: *Jan. 5, 2010

(54) DIVISIONLESS BASEBAND EQUALIZATION IN SYMBOL MODULATED COMMUNICATIONS

(75) Inventors: Hui-Ling Lou, Palo Alto, CA (US); Kok-Wui Cheong, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 212 days.

This patent is subject to a terminal disclaimer.

(21) Appl. No.: 11/645,881

(22) Filed: Dec. 27, 2006

Related U.S. Application Data

(63) Continuation of application No. 10/590,708, filed on Oct. 31, 2006, which is a continuation of application No. 10/259,142, filed on Sep. 26, 2002, now Pat. No. 7,133,473.

(60) Provisional application No. 60/357,317, filed on Feb. 15, 2002.

(51) Int. Cl.
*H04L 27/06* (2006.01)
*H03M 13/03* (2006.01)

(52) U.S. Cl. ................ 375/341; 714/794

(58) Field of Classification Search ........ 375/222, 375/223, 229–232, 260–262, 264, 265, 341, 375/350; 714/794–796
See application file for complete search history.

(56) References Cited

U.S. PATENT DOCUMENTS

| | | | |
|---|---|---|---|
| 5,289,504 A | 2/1994 | Wilson et al. | |
| 5,303,263 A | 4/1994 | Shoji et al. | |
| 5,432,821 A | 7/1995 | Polydoros et al. | |
| 5,946,292 A | 8/1999 | Tsujishita et al. | |
| 6,081,562 A | 6/2000 | He et al. | |
| 6,219,389 B1 | 4/2001 | Pappas et al. | |
| 6,317,470 B1 | 11/2001 | Kroeger et al. | |
| 6,704,903 B1 | 3/2004 | Leung et al. | |
| 7,133,473 B1* | 11/2006 | Lou et al. | 375/341 |
| 2001/0053143 A1 | 12/2001 | Li et al. | |
| 2002/0164967 A1* | 11/2002 | Miyoshi et al. | 455/226.1 |
| 2004/0114675 A1 | 6/2004 | Crawford | |

FOREIGN PATENT DOCUMENTS

| | | |
|---|---|---|
| EP | 1 128 592 A2 | 8/2001 |
| EP | 1 164 760 A1 | 12/2001 |

OTHER PUBLICATIONS

Cheong, Kok-Wui; "Soft Viterbi Decoding (Preliminary)"; May 30, 2001; 20 pages.
U.S. Appl. No. 10/259,088, Lou et al.
U.S. Appl. No. 10/259,024, Lou et al.
"802.16 IEEE Standart for Local and Metropolitan Area Networks; Part 16: Air Interface for Fixed Broadband Wireless Access Systems," 802.16 IEEE Standart for Local and Metropolitan Area Networks, Oct. 1, 2004, pp. i-xxxiv and pp. 1-857, IEEE Std. 802.16-2004, IEEE, United States.

(Continued)

*Primary Examiner*—Don N Vo

(57) ABSTRACT

A receiver baseband processor comprises a channel estimator that generates a channel estimate from a received symbol. A phase demodulator receives the channel estimate from the channel estimator and selectively rotates the phase of the received symbol. A decoder comprises a branch metric calculator that computes a plurality of branch metrics based on the channel estimate and selectively phase rotated received symbol. A most-likely symbol estimator estimates a clean symbol based on the plurality of branch metrics.

32 Claims, 11 Drawing Sheets

OTHER PUBLICATIONS

IEEE Standards Dept., Further Higher-Speed Physical Layer Extension in the 2.4 GHz Band; IEEE Std. 802.11g/D2.8 (Supplement to ANSI/IEEE Std. 802.11 Edition), May 2002, pp. 1-48, IEEE, New York.

ANSI/IEEE, ANSI/IEEE Std. 802.11, Information Technology—Telecommunications and Information Exchange Between Systems— Local and Metropolitan Area Networks—Specific Requirements, Part 11: Wireless LAN Medium Access Control (MAC) and Physical Layer (PHY) Specifications, Aug. 20, 1999, pp. i-xvi and 1-153, IEEE, US.

IEEE, IEEE Std. 802.11a-1999, Supplement to IEEE Standard for Information Technology—Telecommunications and Information Exchange Between Systems—Local and Metropolitan Area Networks—Specific Requirements, Part 11: Wireless LAN Medium Access Control (MAC) and Physical Layer (PHY) Specifications: High Speed Physical Layer in the 5 GHZ Band, Dec. 30, 1999, pp. i-vii and 1-93, IEEE, US.

IEEE, IEEE Std. 802.11b-1999, Supplement to IEEE Standard for Information Technology—Telecommunications and Information Exchange Between Systems—Local and Metropolitan Area Networks—Specific Requirements, Part 11: Wireless LAN Medium Access Control (MAC) and Physical Layer (PHY) Specifications: High-Speed-Physical Layer Extension in the 2.4 GHZ Band, Feb. 20, 1999, pp. i-vii and 1-89, IEEE US.

IEEE, IEEE P802.16a/D2-2002, IEEE Draft Standard for Local and Metropolitan Area Networks—Part 16: Air Interface for Fixed Broadband Wireless Access Systems— Medium Access Control Modifications and Additional Physical Layer Specification for 2-11 GHz, 2002, pp. 1-253, IEEE US.

Rappaport, Theodore, Wireless Communications Principles & Practice, 1995, pp. 325-332, Prentics Hall, US.

Forney, G. David Jr., The Viterbi Algorithm, Proceedings of the IEEE, Mar. 1973, pp. 268-278, vol. 61, No. 3, IEEE, US.

Lou, Hui-Ling, Implementing the Viterbi Algorithm, IEEE Signal Processing Magazine, 1995, pp. 42-52, IEEE, US.

Van Nee, Richard, et al., OFDM for Wireless Multimedia Communications, Jan. 2000, Artech House Publishers, US.

Hutter, A.A. et al., On the Impact of Channel Estimation for Multiple Antenna Diversity Reception in Mobile OFDM Systems, 2000, 34th Ansilomar Conference, US.

* cited by examiner

DIVISIONLESS BASEBAND EQUALIZATION IN SYMBOL MODULATED COMMUNICATIONS

CROSS-REFERENCE TO RELATED APPLICATIONS

This application is a Continuation of U.S. patent application No. 10/590,708, filed on Oct. 31, 2006, which is a Continuation of U.S. patent application No. 10/259,142, filed on Sep. 26, 2002 and issued as U.S. Pat. No. 7,133,473, which claims priority benefit under 35 U.S.C. §119(e)(1) to U.S. Provisional Application No. 60/357,317, filed on Feb. 15, 2002. The disclosures of the above applications are incorporated herein by reference.

TECHNICAL FIELD

The invention generally relates to symbol modulated communication techniques, and more particularly, to a method and apparatus for division-free baseband equalization of symbol modulated signals.

BACKGROUND

The past few years has witnessed the ever-increasing availability of relatively cheap, low power wireless data communication services, networks and devices, promising near wire speed transmission and reliability. One technology in particular, described in the IEEE Standard 802.11a (1999) and Draft IEEE Standard 802.11g (2002) High Rate PHY Supplements to the ANSI/IEEE Standard 802.11, 1999 edition, collectively incorporated herein fully by reference, has recently been commercialized with the promise of 54 Mbps effective bandwidth, making it a strong competitor to traditional wired Ethernet and the more ubiquitous "802.11b" or "WiFi" 11 Mbps mobile wireless transmission standard.

IEEE 802.11a and 802.11g or "802.11a/g" compliant transmission systems achieve their high data transmission rates using Orthogonal Frequency Division Modulation or OFDM encoded symbols mapped up to 64 QAM multicarrier constellation. Before final power amplification and transmission, the multicarrier OFDM symbol encoded symbols are converted into the time domain using Inverse Fast Fourier Transform techniques resulting in a relatively high-speed time domain signal with a large peak-to-average ratio (PAR). OFDM is also used in fixed broadband wireless access systems such as proposed in IEEE Standard 802.16a: Air Interface for Fixed Broadband Wireless Access Systems Part A: Systems between 2 and 1 GHz, Draft working document, February 2002, ("802.16a") which is incorporated herein fully by reference.

The receiver portion of a wireless communications systems compliant with the aforementioned 802.11a/802.11g and 802.16a standards generally includes an RF receiving unit to handle RF downconversion and filtering of received signals in one or more stages and a baseband processing unit to demodulate OFDM encoded symbols bearing the data of interest. FIG. 2 illustrates a known receiver baseband processing unit 200, a channel model 201 and a corresponding encoding transmitter baseband processor 260 to conceptually illustrate the relationship between a received OFDM symbol $Y_n$ in relation to its originally transmitted counterpart OFDM symbol $X_n$ and the pre FEC version $\tilde{X}_n$, taking into account the channel impulse response h(t) and intervening noise v(t) (Additive White Gaussian Noise or AWGN in particular), assuming that the channel impulse response h(t) is shorter than the guard interval (using e.g. cyclic prefix). To ease understanding, conventional RF upconversion transmission, and downconversion interposing the baseband processing units 200 and 260, are omitted from FIG. 2. More specifically, the channel model 201 illustrates the following relationship:

$$Y_{k,n} = g_n H_{k,n} \cdot X_{k,n} + g_n v_{k,n} \tag{0}$$

where $X_{k,n}$ is the transmitted symbol of the $k^{th}$ sub-carrier during the $n^{th}$ OFDM symbol, $H_{k,n}$ is the channel response corresponding to the $k^{th}$ subcarrier during the $n^{th}$ OFDM symbol, and $v_{k,n}$ is the AWGN in the $k^{th}$ sub-carrier during the $n^{th}$ OFDM symbol. Here, $g_n$ represents the gain compensation for the baseband signal conveying the symbol $Y_n$ provided by an automatic gain control unit (not shown) to maximize the dynamic range and performance of analog to digital conversion. Here, assume $g_n=1$ since, in the single receive path case, $g_n$ is common to all subcarriers and will not therefore affect viterbi decoder performance.

The digital form of each $Y_n$ OFDM symbol presented in the frequency domain is recovered after conventional analog-digital conversion and fast fourier transformation by the ADC 205 and the FFT unit 208 respectively of the received time domain analog baseband signal. Thereafter, demodulation (phase rotation) and Frequency domain EQualization (FEQ) through a FEQ unit 220 is performed on the Fast Fourier Transform (FFT) output to compute $\overline{X}$ (Equation 1 below) before sending it to the viterbi decoder 230 to estimate the most likely transmitted symbol $\hat{X}_n$ at the transmitter. That is, the FEQ 220 computes:

$$\overline{X}_{k,n} = \frac{Y_{k,n}}{\overline{H}_{k,n}} = \frac{\overline{H}_{k,n}^* \cdot Y_{k,n}}{|\overline{H}_{k,n}|^2} \tag{1}$$

where: 1) $\overline{X}_{k,n}$ is the demodulated symbol of the $k^{th}$ sub-carrier during the $n^{th}$ OFDM symbol; 2) $Y_{k,n}$ is the received noisy symbol of the $k^{th}$ subcarrier during the $n^{th}$ OFDM symbol; and 3) $\overline{H}_{k,n}$ is the channel estimate corresponding to the $k^{th}$ subcarrier during the $n^{th}$ OFDM symbol.

In the receiver of an 802.11a/g OFDM system, for example, this operation has to be performed for each of the 52 subcarriers of the OFDM symbol $Y_n$. In a straightforward implementation, the computation requires ~2 complex multiplications and one real division per sub-carrier. This is computationally more intensive than implementing the FFT that requires 96 complex multiplications per 52 carriers. In particular, the implementation of a division operation can be at least 3~5 times more complex than that of a multiplication operation. Thus, it is desirable to eliminate the division or scaling operations required in the FEQ unit 220.

As shown in FIG. 2, the output of the FEQ unit 220 is typically sent to a Viterbi decoder 230 to recover or estimate, based on historical analysis of the traffic in the channels, the most likely transmitted sequence of data symbols or bits. Hard symbol by symbol decisions (via slicer 225) on the output of the FEQ can also be fed back to the channel estimator 210 to improve the channel estimates $\overline{H}_n$.

In a conventional FEQ implementation such as shown in FIG. 2, the received symbol for each carrier, $Y_{k,n}$ is divided by its corresponding channel estimate, $\overline{H}_{k,n}$ that can vary from sub-carrier to sub-carrier in a frequency selective fading environment. Thus, the expected signal to noise ratio per symbol may be varying from sub-carrier to sub-carrier and may deviate significantly from the average. This can reduce the performance of a conventional Viterbi decoder (such as decoder 230) that derives its optimal branch metrics assuming that all the symbols have the same expected Additive White Gaussian Noise (AWGN) noise power. Thus, it is desirable to incorporate the so called Channel State Information (CSI) derived from the channel estimates into the Viterbi decoder metrics to minimize this effect.

It would also be desirable to simplify the configuration of the viterbi decoder and branch metric computation in particular without increasing complexity over conventional designs while retaining these CSI performance benefits.

Any OFDM systems operating in fading channels, including 802.11a/g and 802.16a communications systems, are susceptible to wireless channel fading and multipath interference, particularly in mobile deployments where intervening terrain and buildings block or alter line-of-sight reception. To combat this, known receiver designs may employ plural geographically dispersed antennae in the hopes that at least one of the antennae can avoid the characteristic multipath and fading. One common type of plural antennae receiver is called a selection diversity receiver or simply a diversity receiver, and includes logic to ascertain which one of the RF receive pathways is receiving a "best" version of an incident signal (based on e.g. Received Signal Strength Indication (RSSI) analysis), and will select this "best" signal for downconversion and demodulation decoding while disregarding the remaining received signals. Typically, this involves switching the RF receive pathway or channel bearing this "best signal" into communication with the RF downconversion and baseband processing units while isolating the remaining pathways. Performance gains here remain dependent on individual antennae configuration and placement, but is invariably improved over conventional single channel designs.

Another form of the plural antennae receiver offering significant SNR benefit is the Maximum Ratio Combining (MRC) receiver, in which all the plural received signals are utilized. In particular, the received symbols within the plural signals borne by the RF receive pathways are co-phased to provide coherent voltage addition and are individually weighted to provide optimal SNR. See e.g. T. S. Rappaport, *Wireless Communications,* Prentice Hall, Upper Saddle River, N.J. 1996, pages 326-332 which is incorporated herein fully by reference. As such, the baseband processing unit, especially the FEQ and Viterbi decoder of an MRC receiver is viewed as being especially complex, and so any reduction in such complexity, especially where performance is not affected or even is improved, is desirable.

SUMMARY OF THE INVENTION

To address these and related desires, the present invention is directed in part to joint equalization and decoding methods and apparatus applicable to both hard and soft-decision decoding implementations to eliminate the division operations heretofore believed required by an equalizer. These methods and apparatus can reduce the complexity in the receiver significantly and do not rely on lossy approximations, and are thus believed to provide uncompromised performance over known receiver configurations.

In accordance with one or more disclosed embodiments, Channel State Information (CSI) based on channel estimates, can be used in conjunction with the novel joint equalization and decoding method and apparatus to improve decoder performance.

Another aspect of the present invention is directed to methods and apparatus involving reduced complexity Viterbi decoder decision metrics while continuing to take advantage of CSI benefits. In accordance with one or more disclosed embodiments branch metric computation within the Viterbi decoder of a receiver baseband processing unit may involve the use of piecewise linear approximations. Such approximations may be used in isolation or in conjunction with the aforementioned joint equalization and decoding to simplify overall decoder complexity.

A further aspect of the present invention is directed to improved Viterbi decoding in an MRC receiver through utilizing CSI. Complexity in this type of Viterbi decoder can be likewise reduced by using the aforementioned joint equalization and decoding and piece wise approximation techniques.

Additional aspect features and advantages of this invention will become apparent from the following detailed description of embodiments thereof, which proceeds with reference to the accompanying drawings, in which like reference numerals indicate like parts or features.

DETAILED DESCRIPTION OF THE EMBODIMENTS

The first section below describes joint equalization and Viterbi decoding consistent with several disclosed embodiments of the invention, including those incorporating CSI and hard-decision decoding features. Section 2 describes complexity reduction techniques for computing the branch metrics in a Viterbi decoder with CSI. Finally, Section 3 describes Viterbi decoder complexity reduction in an MRC plural receive antennae environment.

Section 1

Joint Equalization and Decoding

We propose eliminating the division operations in Equation (1) discussed above and demodulate the received symbols using Method I, in rectangular form:

$$Z_{k,n} = \overline{H}^*_{k,n} \cdot Y_{k,n} \qquad (2)$$

or, Method II, in polar form:

$$P_{k,n} = e^{-j\Phi_{k,n}} \cdot Y_{k,n},  \quad (3)$$

where $$\bar{H}_{k,n} = |\bar{H}_{k,n}|e^{j\Phi_{k,n}}. \quad (4)$$

Figure 2:
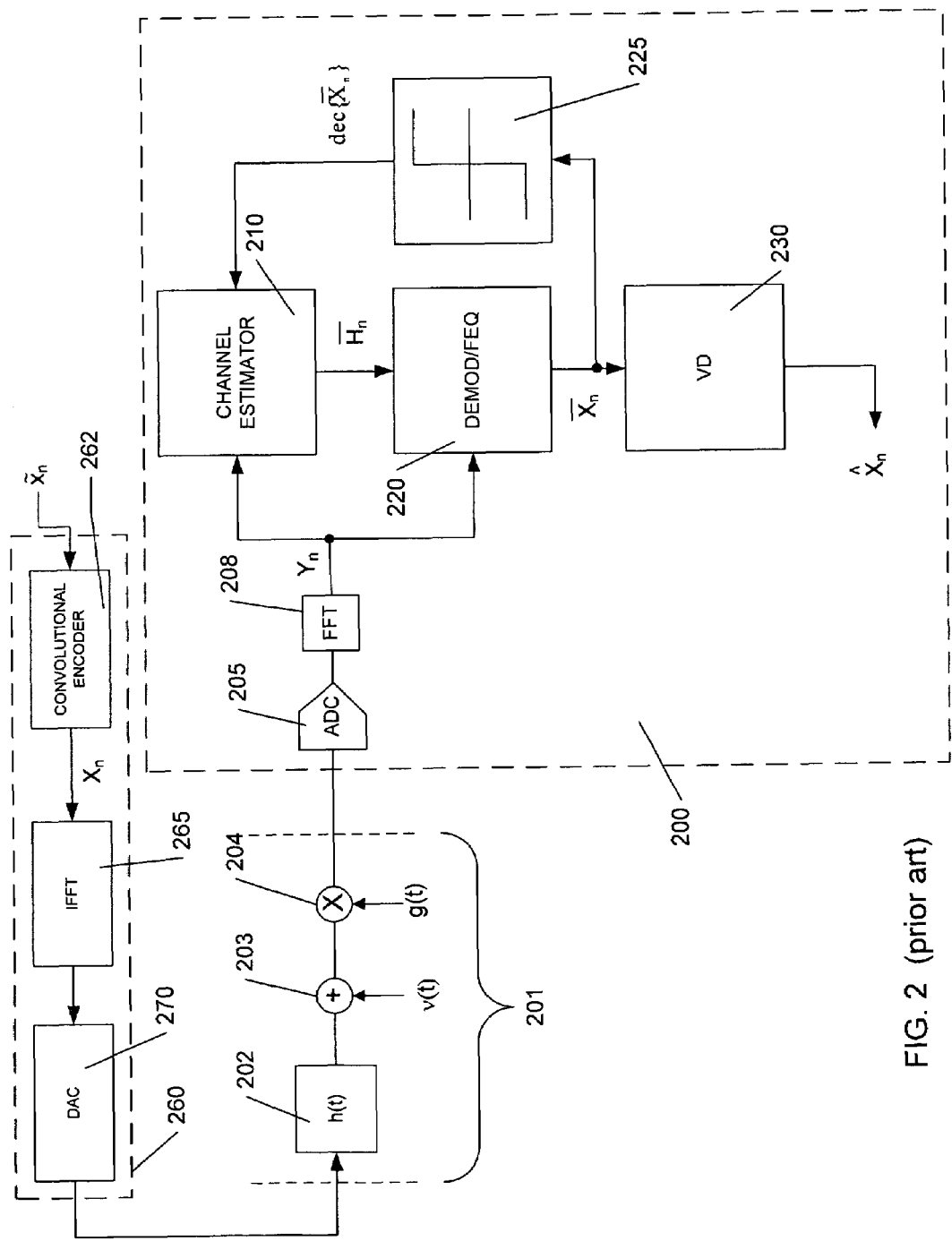
FIG. 2 is a block diagram of a known receiver baseband processing unit.

The in-phase and quadrature demodulated symbols are the real and imaginary parts of $\bar{X}_{k,n}$ (i.e. $\text{Re}\{\bar{X}_{k,n}\}$ and $\text{Im}\{\bar{X}_{k,n}\}$) respectively. The following discusses the changes required in the conventional soft decision Viterbi decoder (such as decoder 230 shown in FIG. 2) as well as the hard-decision symbol-by-symbol (such as the slicer 225 shown in FIG. 2).

Given the proposed demodulation schemes given above, the decision or branch metrics in the Viterbi decoder have to be modified accordingly. We again note that at the receiver, the received symbol, $Y_{k,n}$, can be defined in terms of a channel model (such as the channel model 201 depicted in FIG. 2) such that $$Y_{k,n} = H_{k,n} \cdot X_{k,n} + v_{k,n}, \quad (5)$$

where $X_{k,n}$ is the transmitted symbol of the $k^{th}$ sub-carrier during the $n^{th}$ OFDM symbol, $H_{k,n}$ is the channel response corresponding to the $k^{th}$ subcarrier during the $n^{th}$ OFDM symbol, and $v_{k,n}$ is the AWGN in the $k^{th}$ sub-carrier during the $n^{th}$ OFDM symbol. As noted above, gain compensation need not be considered in the single carrier case with respect to Viterbi decoding, and is thus omitted in this version of Equation 0.

In the following, we derive the corresponding branch metrics for the two demodulation methods proposed above in relation to Equations (2) and (3). To simplify the notations used, we assume that the channel estimate is perfect (though shown in the FIGS. otherwise). That is, $$\bar{H}_{k,n} = H_{k,n} \quad (6)$$

and we denote the real and imaginary parts of a complex quantity as $$\Re\{H_{k,n}\} \equiv H_{k,n,0}, \Im\{H_{k,n}\} \equiv H_{k,n,1}. \quad (7)$$

We turn first to the Viterbi decoder branch metric computation for demodulation Method I using rectangular form. Substituting Equations 5 and 6 into Equation 2, we arrive at $$Z_{k,n} = H^*_{k,n} \cdot Y_{k,n} = |H_{k,n}|^2 X_{k,n} + H^*_{k,n} v_{k,n} \quad (8)$$

and the demodulated in-phase and quadrature symbols, $$\Re\{Z_{k,n}\} \equiv Z_{k,n,0} = |H_{k,n}|^2 X_{k,n,0} + H_{k,n,0} \cdot v_{k,n,0} + H_{k,n,1} \cdot v_{k,n,1} \quad (9)$$

and $$\Im\{Z_{k,n}\} \equiv Z_{k,n,1} = |H_{k,n}|^2 X_{k,n,1} + H_{k,n,o} \cdot v_{k,n,1} - H_{k,n,1} \cdot v_{k,n,0} \quad (10)$$

In a Viterbi decoder, the decision metrics used to determine the most likely transmitted code sequence or symbol are the path metrics that are the accumulated branch metrics corresponding to the state transistions in the paths. The branch metric for each transition, derived for an Additive White Gaussian Noise (AWGN) channel, is defined as the minimum Euclidean distance between the received signal and the codeword associated with the corresponding transition. That is, the branch metrics corresponding to the Equations 9 and 10, $BM_{k,n,i}$, $$BM_{k,n,i} = (Z_{k,n,i} - |H_{k,n}|^2 \cdot X)^2 = Z_{k,n,i}^2 - 2Z_{k,n,i} \cdot |H_{k,n}|^2 \cdot X + (|H_{k,n}|^2 \cdot X)^2, \quad (11)$$

where $i \in \{0,1\}$, and $X \in \{\pm 1\}$ for QPSK, $X \in \{\pm 1, \pm 3\}$ for 16-QAM, and $X \in \{\pm 1, \pm 3, \pm 5, \pm 7\}$ for 64-QAM constellations. Since the term $(Z_{k,n,i}^2)$ is common to all the branch metrics at each stage of the Viterbi decoding process, this term can be subtracted from all the path metrics without changing the MLSE (described below) comparison results. Thus, $$BM_{k,n,i} = -2Z_{k,n,i} \cdot |H_{k,n}|^2 \cdot X + (|H_{k,n}|^2 \cdot X)^2 \quad (12)$$

For QPSK, $X \in \{\pm 1\}$, and the term $(|H_{k,n}|^2 \cdot X)^2 = |H_{k,n}|^4$ is common to all the branch metrics at each decoding stage. Thus, the term can be subtracted from all the path metrics of all the states without changing the comparison results. The scaling factor (2) can also be removed. Thus, $$BM_{k,n,i} = -Z_{k,n,i} \cdot |H_{k,n}|^2 \cdot X \text{ for QPSK}. \quad (13)$$

We note that in a fading environment, the channel response $H_{k,n,i}$ can change from sub-carrier to sub-carrier, and by using the above-derived demodulation methods, the AWGN noise in each sub-carrier symbol may no longer have the same expected power, even if $E(v^2_{k,n,i})$ values are the same. To properly normalize the noise power from sub-carrier to sub-carrier, phase demodulation should be performed relative to the magnitude of the channel response $H_{k,n}$. Namely, we define the relationship $W_{k,n,i} = Z_{k,n,i}/|H_{k,n}|$, which, through substituting Equations (9) and (10) for $Z_{k,n,o}$ and $Z_{k,n,1}$ respectively, we obtain:

$$\Re\{W_{k,n}\} \equiv W_{k,n,0} = |H_{k,n}| \cdot X_{k,n,0} + \frac{(H_{k,n,0} \cdot v_{k,n,0} + H_{k,n,1} \cdot v_{k,n,1})}{|H_{k,n}|} \text{ and} \quad (14)$$

$$\Im\{W_{k,n}\} \equiv W_{k,n,1} = |H_{k,n}| \cdot X_{k,n,1} + \frac{(H_{k,n,0} \cdot v_{k,n,1} - H_{k,n,1} \cdot v_{k,n,0})}{|H_{k,n}|} \quad (15)$$

From which, the Viterbi decoder branch metrics, $BM_{k,n,i}$, can be derived as follows:

$$BM_{k,n,i} = (W_{k,n,i} - |H_{k,n}| \cdot X)^2 = W_{k,n,i}^2 - 2W_{k,n,i} \cdot |H_{k,n}| \cdot X + (|H_{k,n}| \cdot X)^2, \quad (16)$$

where $i \in \{0,1\}$, and $X \in \{\pm 1\}$ for QPSK, $X \in \{\pm 1, \pm 3\}$ for 16-QAM, and $X \in \{\pm 1, \pm 3, \pm 5, \pm 7\}$ for 64-QAM constellations. As before, the branch metric can be simplified to $$BM_{k,n,i} = -2W_{k,n,i} \cdot |H_{k,n}| \cdot X + (|H_{k,n}| \cdot X)^2 \text{ (with CSI)}, \quad (17)$$

and $$BM_{k,n,i} = -W_{k,n,i} \cdot |H_{k,n}| \cdot X \text{ for QPSK (with CSI)}. \quad (18)$$

Given that $W_{k,n,i} = Z_{k,n,i}/|H_{k,n}|$, the branch metric incorporating CSI demodulation method I using rectangular form, $$BM_{k,n,i} = -2Z_{k,n,i} \cdot X + (|H_{k,n}| \cdot X)^2 \text{ (with CSI)}. \quad (19)$$

Again, for QPSK, $X \in \{\pm 1\}$, and $$BM_{k,n,i} = -Z_{k,n,i} \cdot X \text{ for QPSK (with CSI)}. \quad (20)$$

We note that no approximation was assumed above. The division operations required by the FEQ are eliminated and the channel response estimates are incorporated into the Viterbi decoder decision metrics (in particular, the branch metrics) instead. However, we describe in Section 2 that by using a bit-by-bit piecewise branch metric approximation and incorporating CSI, the decoder complexity can be reduced significantly with very little practical performance loss.

However, first consider Viterbi decoder branch metric computation for demodulation Method II (using polar form). Substituting Equations 5 and 6 into Equation 3, we arrive at $$P_{k,n} = e^{-j\Phi_{k,n}} \cdot Y_{k,n} = |H_{k,n}| \cdot X_{k,n} + e^{-j\Phi_{k,n}} \cdot v_{k,n} \quad (21)$$

In this case, the expected noise power in each sub-carrier is the same. Thus, as will be appreciated by those ordinarily skilled in the art, no normalization of the noise component with the channel estimates is required. Similar to demodulation method I described above, the branch metrics, $BM_{k,n,i}$, can be expressed as:

$$BM_{k,n,i} = -2P_{k,n,i}|H_{k,n}| \cdot X + (|H_{k,n}| \cdot X)^2 \text{ (with CSI)}, \quad (22)$$

where $i \in \{0,1\}$, and $X \in \{\pm 1\}$ for QPSK, $X \in \{\pm 1, \pm 3\}$ for 16-QAM, and $X \in \{\pm 1, \pm 3, \pm 5, \pm 7\}$ for 64-QAM constellations, and thus $$BM_{k,n,i} = -P_{k,n,i}|H_{k,n}| \cdot X \text{ for QPSK (with CSI)}. \quad (23)$$

We note that the derivation given above is exact and therefore will not compromise Viterbi decoder performance compared to that of a conventional receiver.

Figure 3:
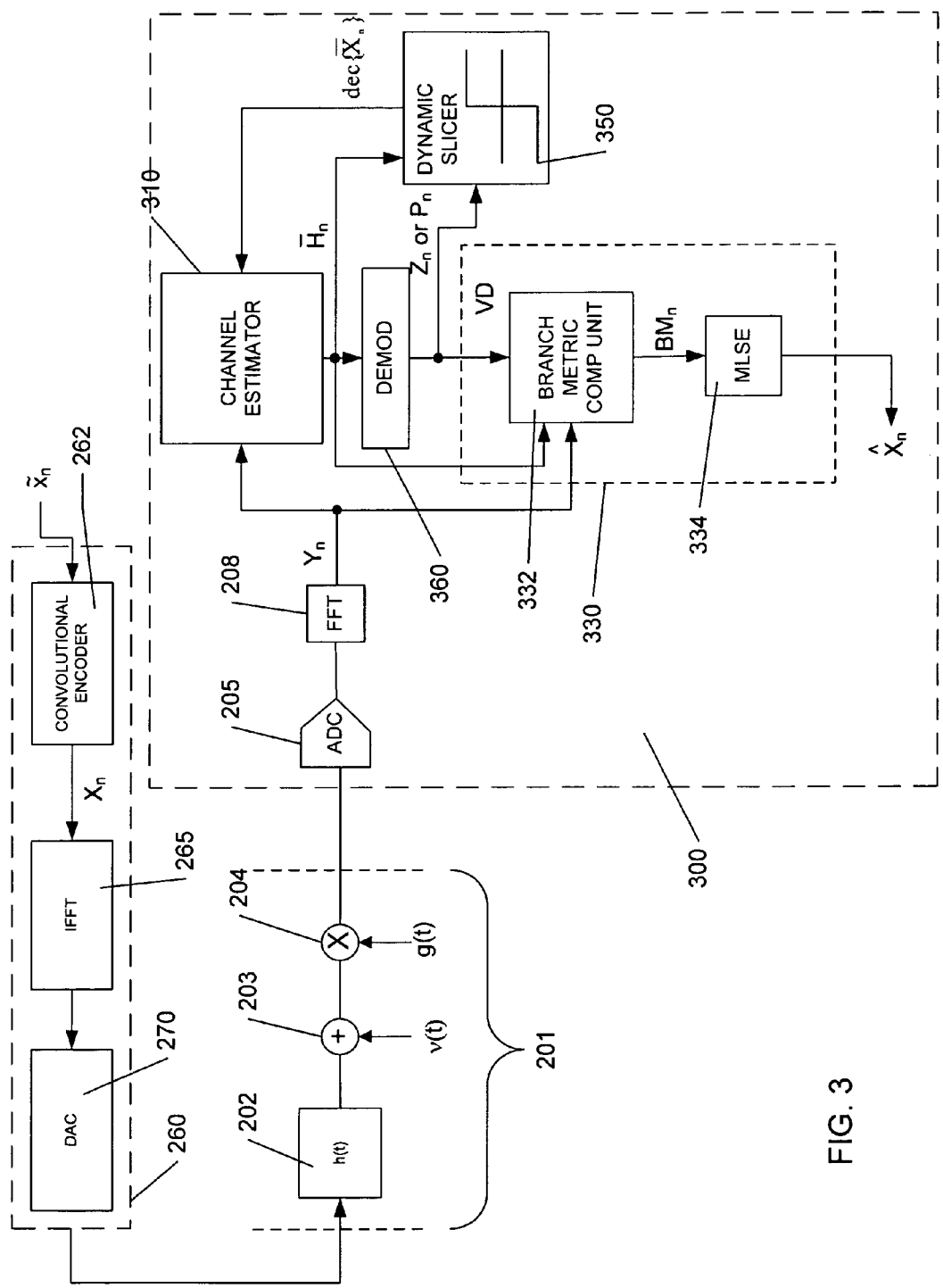
FIG. 3 is a block diagram of a receiver baseband processing unit according to an embodiment of the invention.

Turn now to the receiver baseband processing unit 300 according to an embodiment of the invention shown in FIG. 3 which incorporates joint equalization and decoding as noted above. Here, unlike the conventional receiver baseband processing unit 200 shown in FIG. 2, the division dependent FEQ unit 220 is eliminated, and equalization and decoding functions based in part on the channel estimates $\overline{H}_{k,n,i}$ are performed directly by the Viterbi decoder 330. A phase demodulator 360 issued to derive $Z_n$ and/or $P_n$ as noted above in Equations 2 and 3. The branch metric computation unit 332 of the Viterbi decoder calculates the real (i=0) and imaginary (i=1) branch metric components (or $BM_i$) for each subcarrier k of the $n^{th}$ received OFDM symbol, $Y_n$, recovered by the FFT 208 using Equation 13 for QPSK rate symbol modulation or Equation 12 for higher rate symbol modulation (e.g. 16-QAM or 64-QAM) where reliance on CSI is not desired. Where CSI decoding improvements are desired, the branch metric computation unit calculates the $BM_i$ for each subcarrier k of the nth received OFDM symbol, $Y_n$, using Equation 20 for QPSK rate symbol modulation, or Equation 19 for higher rate symbol modulation. Note that each dimension I and Q is handled separately as a consequence of the phase rotation provided by the phase demodulator 360.

Once each $BM_i$ is calculated by the branch metric computation unit 332 for the current symbol $Y_n$, they are transferred to the Maximum Likelihood Sequence Estimation unit 334 ("or "MLSE"), which performs conventional survivor path and path metric updating, as well as most likely path trace back to recover $\hat{X}_n$. For more information regarding MLSE 334 operation and functions, see e.g. Lou, Hui-Ling "Implementing the Viterbi Algorithm", IEEE Signal Processing Magazine, September 1995, pages 42-52 which is incorporated herein fully by reference.

Figure 6:
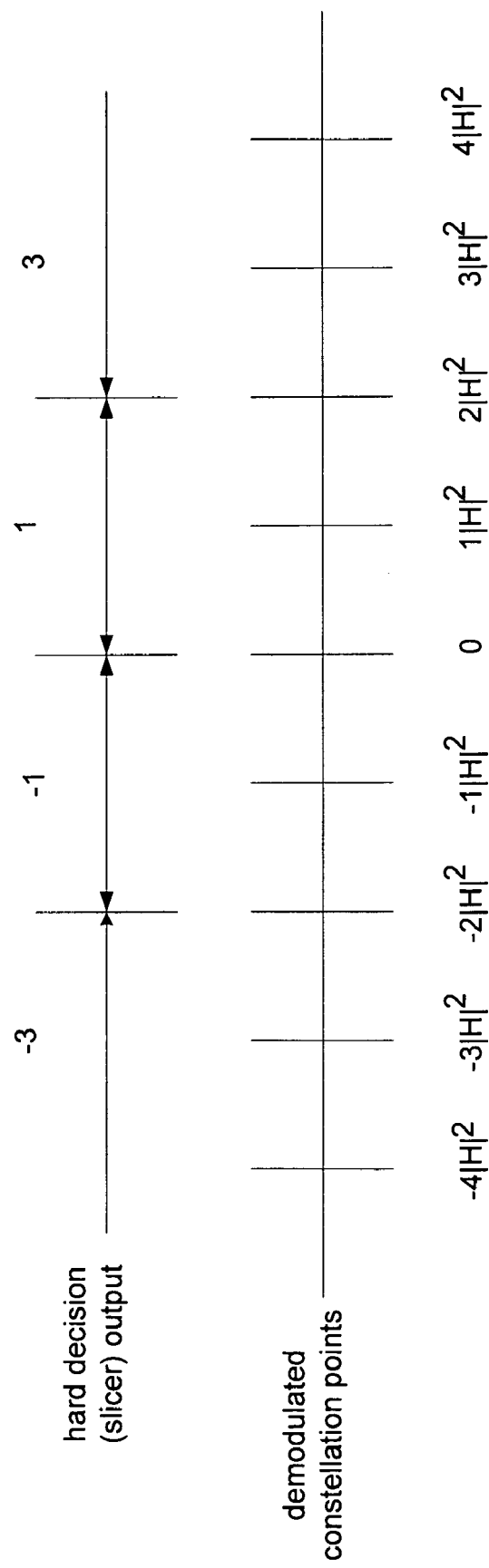
FIG. 6 depicts decision-making of the slicer shown in FIGS. 4 and 5 consistent with the disclosed embodiments of the invention.

The MLSE unit 334 estimates $\hat{X}_n$ representing the most likely symbol transmitted ($\tilde{X}_n$). In view of known limitations of the Viterbi algorithm $\hat{X}_n$ may or may not be the same as $\tilde{X}_n$. As shown in FIG. 3, $Z_n$ or $P_n$ may also be fed to a hard-decision slicer 350 that, based on slicing rules detailed below with reference to FIGS. 6 and 7, will generate $dec\{\overline{X}_n\}$ which is turn sent to the channel estimator 310 to improve the channel estimates $\overline{H}_{n+1}$. More detail on the functions and interactions of the dynamic slicer 350 will be discussed below with reference to FIGS. 6 and 7.

In practical implementation of the Viterbi decoder 330, the branch metrics may be quantized and the number of quantization bits minimized to minimize the complexity in the decoder. With the joint equalization and decoding scheme proposed above, the branch metrics become necessarily a function of the channel estimates $\overline{H}_{k,n}$. Thus, the quantization noise of the branch metrics are affected by the quantization noise of the channel estimates. Furthermore, since the channel estimates change dynamically, these quantization levels should be determined dynamically in order to maintain or improve receiver performance.

To minimize the quantization noise for these channel estimates $\overline{H}_{k,n}$, the maximum or average value of the channel estimates should be determined and normalized before subjecting to quantization. That is, comparison operations are needed in such case to find the maximum or average value, and division operations are required to implement the normalization prior to quantization. Furthermore, if the convolutional coder 262 encodes over the duration of a packet, all the channel estimates corresponding to the same packet duration should be subjected to the same normalization factor. This can significantly introduce delay in the decoder as the proper normalization factor can only be determined after the whole packet is received.

However, we note that in 802.11 a/g or 802.16a compliant communications systems, the channels are quasi static so that we can approximate our search for the maximum or average by looking at the first transmitted OFDM. That is, we assume $$H_{k,0} \approx H_{k,1} \approx H_{k,2} \ldots, \quad (24)$$

and for the 802.11a system, we determine the normalization factor using the channel estimates for the 52 tones of the first transmitted OFDM symbols of the encoder block, $\{H_{0,0}, H_{1,0}, \ldots, H_{51,0}\}$.

Consistent with our desire to reduce decoder complexity, instead of comparing and dividing to find the normalization value and performing normalization, we propose a simplified normalization method instead. To illustrate our proposed technique, we assume that the desired normalization factor is the maximum value of the squared magnitude of the channel estimates. We note that this value is bounded by a power of 2. Thus, we compute max $|H_{k,0}|^2$ over all the subcarriers in the first OFDM symbol, where $k = \{0, 1, 2, \ldots, 51\}$, at least in the 802.11a case. To illustrate our approach to search, normalize and quantize, we assume $|H_{k,0}|^2$ are 10-bit in unsigned notation:

$$|H_{k,0}|^2 = \{b_{k,0,0}, b_{k,0,1}, \ldots, b_{k,0,9}\}, \quad (25)$$

where $b_{k,0,0}$ to is the Most Significant Bit (MSB). We further assume that the resultant $|H_{k,0}|^2$ are to be quantized to 6 bits. Denoting '^' a logical OR operation and '&' a logical AND operation, we propose the following pseudocode to arrive at $|H_{k,0}|^2$:

if $(b_{0,0,0} \wedge b_{1,0,0} \wedge b_{2,0,0} \wedge \ldots \wedge b_{51,0,0} = 1)$ $|H_{k,0}|^2 = |H_{k,0}|^2$ & 1111110000 exit else if $(b_{0,0,1} \wedge b_{1,0,1} \wedge b_{2,0,1} \wedge \ldots \wedge b_{51,0,1} = 1)$ $|H_{k,0}|^2 = |H_{k,0}|^2$ & 0111111000 exit else if $(b_{0,0,2} \wedge b_{1,0,2} \wedge b_{2,0,2} \wedge \ldots \wedge b_{51,0,2} = 1)$ $|H_{k,0}|^2 = |H_{k,0}|^2$ & 0011111100 exit else if $(b_{0,0,3} \wedge b_{1,0,3} \wedge b_{2,0,3} \wedge \ldots \wedge b_{51,0,3} = 1)$ $|H_{k,0}|^2 = |H_{k,0}|^2$ & 0001111110 exit else $|H_{k,0}|^2 = |H_{k,0}|^2$ & 0000111111 endif As mentioned previously, in many practical receiver designs, hard-decision decoding is performed on the output symbols of the FEQ to find their closest constellation points in order to perform decision-directed equalization or channel estimation. To determine the hard decision, we denote Dec$\{\overline{X}_{k,n}\}$ as the closest QAM constellation point to $\overline{X}_{k,n}$, using hard decision decoding, and $\overline{X}_{k,n}$ computed using Equation 1, $$\overline{X}_{k,n} = \frac{Y_{k,n}}{\overline{H}_{k,n}} = X_{k,n} + \frac{v_{k,n}}{\overline{H}_{k,n}},$$

where $X_{k,n,i} \in \{\pm 1\}$ for QPSK, $X_{k,n,i} \in \{\pm 1, \pm 3\}$ for 16-QAM, and $X_{k,n,i} \in \{\pm 1, \pm 3, \pm 5, \pm 7\}$ for 64-QAM constellations, and $i \in \{0,1\}$ represents the in-phase (I) and quadrature (Q) components of $X_{k,n}$. In this case, the hard-decision decoded symbol, Dec$\{\overline{X}_{k,n}\}$, can be computed by rounding $\overline{X}_{k,n,i}$ to its corresponding nearest constellation point, $X_{k,n,i}$, in each dimension.

However, by using the division-free demodulation techniques in Equations 2 and 3, and from Equations 8 and 21 where, $$Z_{k,n} = |\overline{H}_{k,n}|^2 \cdot \overline{X}_{k,n} = |H_{k,n}|^2 \cdot X_{k,n} + H^*_{k,n} \cdot v_{k,n}, \quad (28)$$

and $$P_{k,n} = |\overline{H}_{k,n}| \cdot \overline{X}_{k,n} = |H_{k,n}| \cdot X_{k,n} + e^{-j\Phi_{k,n}} \cdot v_{k,n}, \quad (29)$$

the hard-decision symbol, Dec$\{\overline{X}_{k,n}\}$ needs to be computed given $Z_{k,n}$ or $P_{k,n}$, and both terms contain the instantaneous channel estimate $|\overline{H}_{k,n}|$. Thus, a dynamic slicer (e.g. slicer 350) based on the current values of $|\overline{H}_{k,n}|$ should be used to determine Dec$\{\overline{X}_{k,n}\}$.

By using the proposed demodulation technique given in Equation 2, the following slicing rules presented below in pseudocode form can be used to make a hard decision on the in-phase and quadrature components to the nearest constellation point in a QPSK, 16-QAM or 64-QAM constellation.

Slicer rule for QPSK:
 If $(Z_{k,n,j} \geq 0)$, Dec$\{\overline{X}_{k,n}\} = 1$, otherwise, Dec$\{\overline{X}_{k,n,i}\} = -1$.

Figure 7:
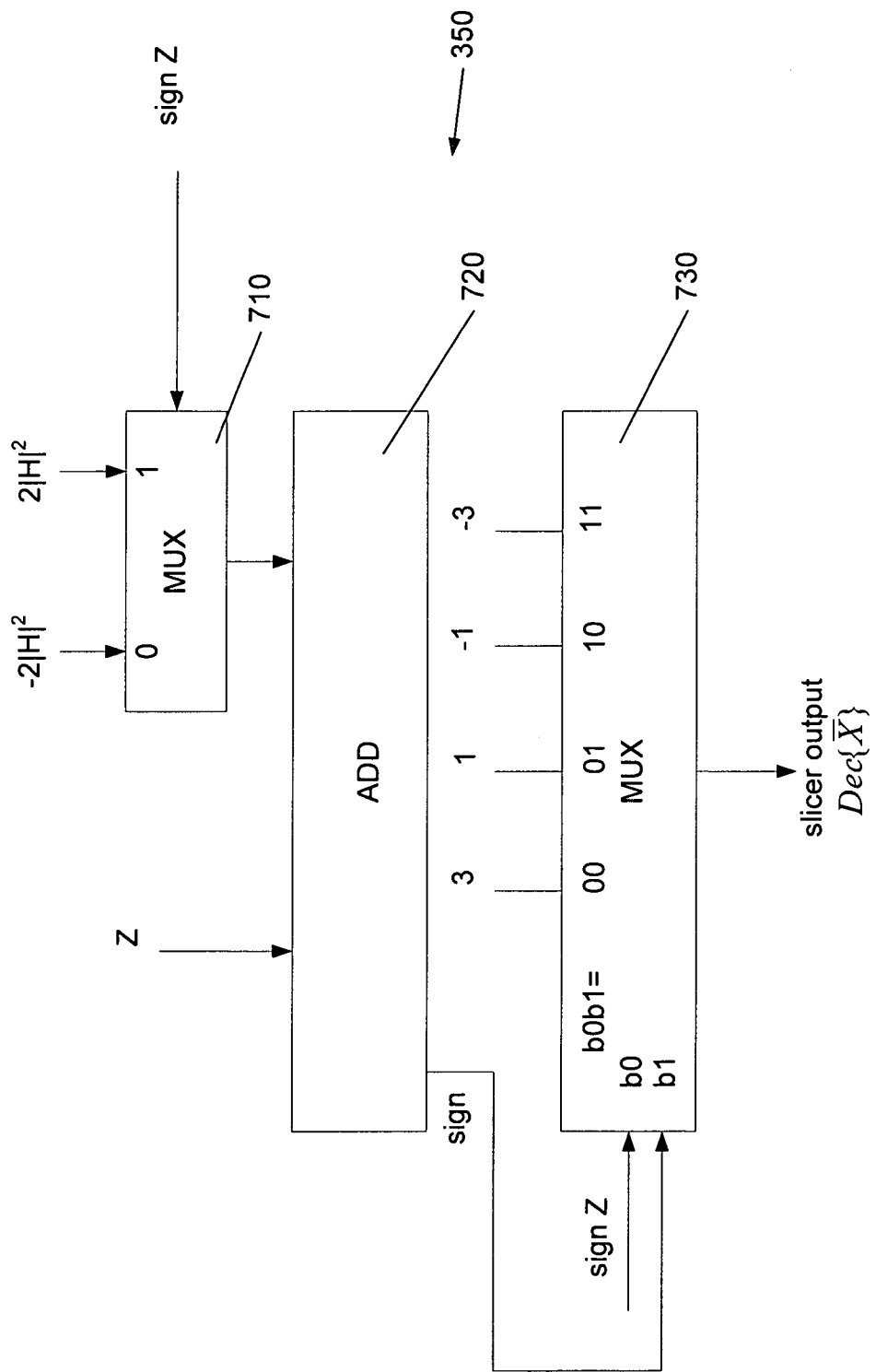
FIG. 7 is a block diagram of a hard-decision slicer capable of undertaking the decision-making illustrated in FIG. 6.

Slicer rule for 16-QAM:
 If $((|Z_{k,n,i}| - 2|\overline{H}_{k,n}|^2) \leq 0)$, Dec$\{\overline{X}_{k,n,i}\} = \pm 1$, otherwise Dec$\{\overline{X}_{k,n,i}\} = \pm 3$.
The sign is dependent on the sign of $Z_{k,n,i}$ (see e.g. FIG. 6). A straightforward implementation of the slicer 350 is shown in FIG. 7 to illustrate that this slicer 350 can be implemented by a combination of multiplexers 710, 730 and an adder 720.

Pseudocode for the 64-QAM rate is provided below:

Slicer rule for 64-QAM:
 if $((|Z_{k,n,i}| - 2|\overline{H}_{k,n}|^2) \leq 0)$, Dec$\{\overline{X}_{k,n,i}\} = \pm 1$, exit;
 if $((|Z_{k,n,i}| - 3|\overline{H}_{k,n}|^2) \leq 0)$, Dec$\{\overline{X}_{k,n,i}\} = \pm 3$, exit;
 if $((|Z_{k,n,i}| - 6|\overline{H}_{k,n}|^2) \leq 0)$, Dec$\{\overline{X}_{k,n,i}\} = \pm 5$, exit; Dec$\{\overline{X}_{k,n,i}\} = \pm 7$. exit;
The sign is dependent on the sign of $Z_{k,n,i}$.

By using the proposed demodulation technique given in Equation 3, similar slicing rules can be derived for QPSK, 16-QAM and 64-QAM constellations to compute Dec$\{\overline{X}_{k,n}\}$.

Slicer rule for QPSK:
 if $(P_{k,n} \geq 0)$, Dec$\{\overline{X}_{k,n,i}\} = 1$, otherwise Dec$\{\overline{X}_{k,f,i}\} = -1$, Slicer rule for 16-QAM:
 if $((|P_{k,n,i}| - 2|\overline{H}_{k,n}|) \leq 0)$, Dec$\{\overline{X}_{k,n,i}\} = 1$, otherwise Dec$\{\overline{X}_{k,n,i}\} = \pm 3$.
The sign is dependent on the sign of $P_{k,n,i}$.

Slicer rule for 64-QAM:
 if $((|P_{k,n,i}| - 2|\overline{H}_{k,n}|) \leq 0)$, Dec$\{\overline{X}_{k,n,i}\} = \pm 1$, exit;
 if $((|P_{k,n,i}| - 4|\overline{H}_{k,n}|) \leq 0)$, Dec$\{\overline{X}_{k,n,i}\} = \pm 3$, exit;
 if $((|P_{k,n,i}| - 6|\overline{H}_{k,n}|) \leq 0)$, Dec$\{\overline{X}_{k,n,i}\} = \pm 5$, exit;
 Dec$\{\overline{X}_{k,n,i}\} = \pm 7$. exit;
The sign is dependent on the sign of $P_{k,n,i}$.

Section 2

Reduced Complexity Viterbi Decoder Decision Metrics with Channel State Information This section introduces an approximation method to compute the Viterbi decoder branch metrics that can significantly reduce the computation required over known systems, and can be used in isolation or in combination with the joint equalization and decoding techniques described herein. This method is particularly beneficial to systems where interleaving is performed between the convolutional encoder output and the QAM symbol mapper, as with the case in 802.11a, 802.11g and 806.16a compliant communications.

To summarize the novel bit-by-bit linear piecewise approximation approach, we represent the I and Q demodulated symbol, $\overline{X}_{k,n,0}$ or $\overline{X}_{k,n,1}$ in bits. That is, if $\overline{X}_{k,n}$ is a demodulated symbol of a 16-QAM constellation, we can represent the real-part of $\overline{X}_{k,n}$ by, $$\overline{X}_{k,n,0} = \{b_0, b_1\}, \quad (30)$$

and determine the corresponding branch metrics for $b_0$ and $b_1$ in the Viterbi decoder. The expression to compute the branch metric depends on the piecewise region the demodulated I or Q symbol is in, and the position of bit, $b_0$ or $b_1$, for which the branch metric is to be computed. However, all the expressions take the form:

$$BM_{k,n,i} = -(\overline{X}_{k,n,i} - m) \cdot \text{sign}(b_i), \quad (31)$$

where $m=0$ for QPSK, $m \in \{0,2\}$ for 16-QAM and $m \in \{0,2,4\}$ for 64-QAM constellations, and $b_i \in \{\pm 1\}$.

To improve the Viterbi decoder performance, CSI may be incorporated to normalize the expected noise power appropriately as described above in Section 1. If $W_{k,n}$ is demodulated using From Equation 18, the piecewise branch metric should be $(\pm W_{k,n} \cdot |H_{k,n}|)$. That is, the slope of the branch metrics will be $\pm |H_{k,n}|$, depending on whether the sign of $b_1$ is $-1$ or 1. Furthermore, the piecewise decision regions are separated by $m \cdot |H_{k,n}|$ (see Equations 14 and 15), where $m=0$ for QPSK, $m \in \{0,2\}$ for 16-QAM and $m \in \{0,2,4\}$ for 64-QAM constellations. In short, the branch metrics will be of the form, $$BM_{k,n,i} = -|H_{k,n}|(|W_{k,n}| - |H_{k,n}| \cdot m) \cdot \text{sign}(b_i) \text{ (with CSI)}, \quad (32)$$

If the conventional demodulation method (Equation 1) is used, $$\overline{X}_{k,n} = \frac{W_{k,n}}{|H_{k,n}|}. \quad (33)$$

Thus, the equations to compute the branch metrics have the form, $$BM_{k,n,j} = -|H_{k,n}|^2 (|\overline{X}_{k,n,i} - m) \cdot \text{sign}(b_i) \text{ (with CSI)} \quad (34)$$

Figure 4:
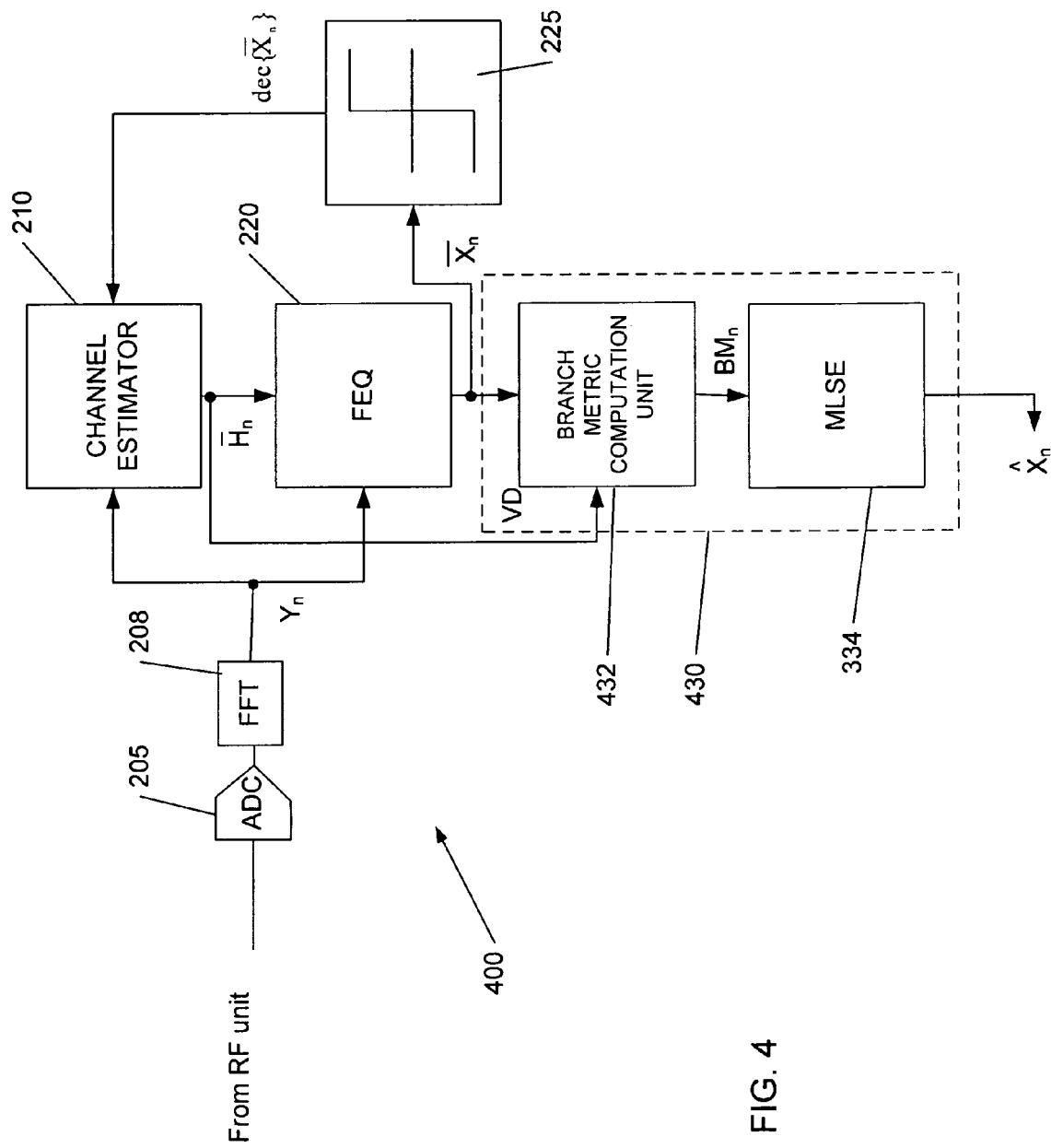
FIG. 4 is a block diagram of a receiver baseband processing unit according to an alternative embodiment of the invention.

FIG. 4 depicts a receiver baseband processing unit 400 in which unlike the embodiment shown in FIG. 3, still includes a separate demod/FEQ 220 and Viterbi decoder 430. However, the Viterbi decoder 430 differs from the conventional Viterbi decoder 230 shown in FIG. 2 in that it includes a branch metric computation unit 432 that generates $BM_i$ for each subcarrier of a given OFDM symbol Y using the relationship defined in Equation 34.

Similarly, it can be shown that by using the reduced-complexity joint equalization and decoding approach described above, and depending on the demodulation method chosen (Equations 2 or 3), the bit-by-bit piecewise approximation branch metrics have the form:

$$BM_{k,n,i} = -(|Z_{k,n,i}| - |H_{k,n}|^2 \cdot m) \cdot \text{sign}(b_i), \quad (35)$$

or $$BM_{k,n,i} = -|H_{k,n}|(|P_{k,n,i}| - |H_{k,n}| \cdot m) \cdot \text{sign}(b_i), \quad (36)$$

where m=0 for QPSK, m∈{0,2} for 16-QAM and m∈{0,2,4} for 64-QAM constellations, and $b_i \in \{\pm 1\}$.

Figure 5:
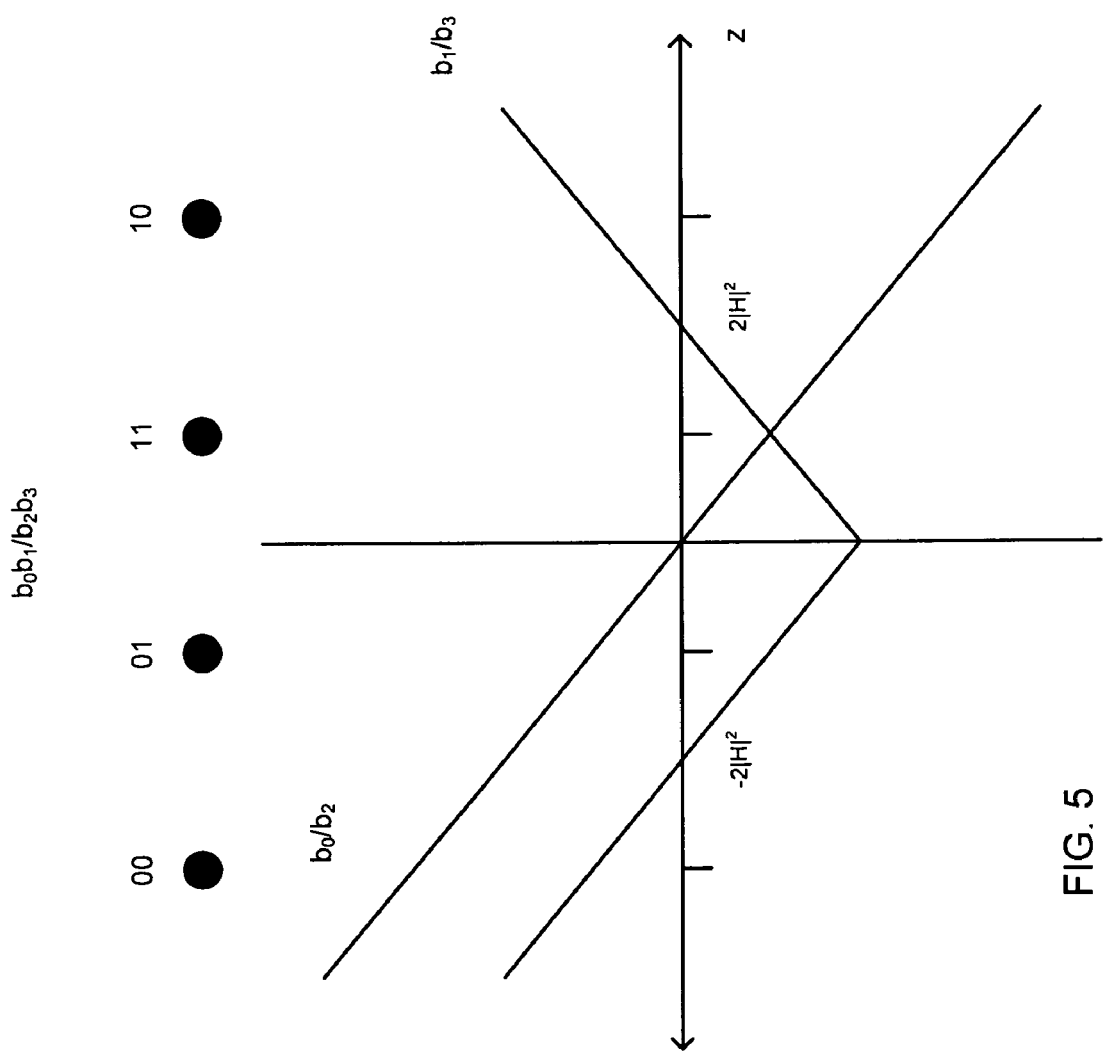
FIG. 5 illustrates branch metric approximation according to an embodiment of the present invention.

FIG. 5 illustrates the branch metric approximation for a 16-QAM constellation where the demodulated symbol is $Z_{k,n,i}$. As mentioned previously, though not required, the branch metric approximations noted in Equations 35 and 36 may be conveniently implemented by the branch metric computation unit 332 shown in FIG. 3, which in simulation produced an 8 dB SNR performance gain.

Section 3

Multiple Receive Antenna Equalization And Decoding

Figure 8:
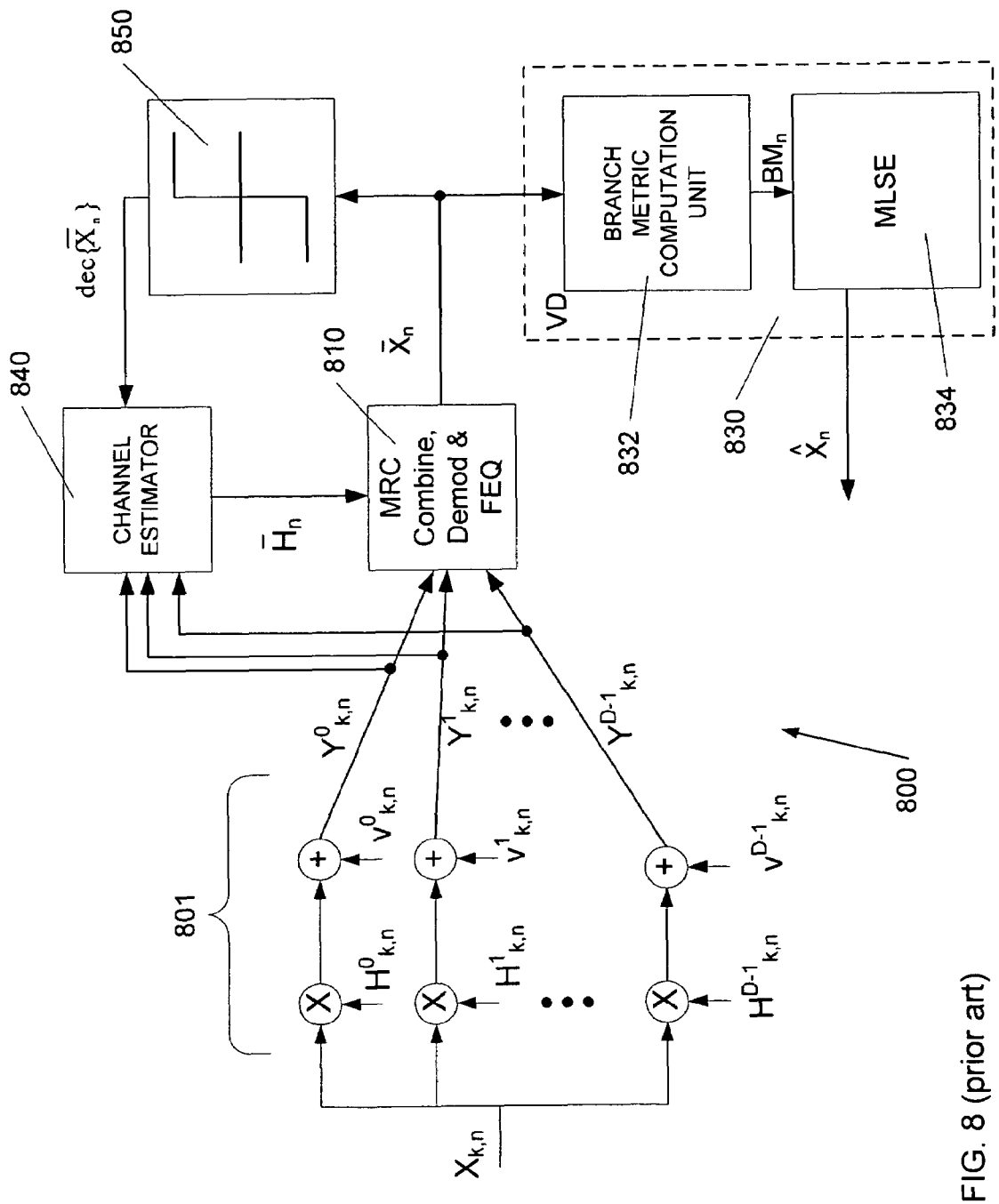
FIG. 8 is a simplified block diagram of a known receiver baseband processing unit incorporating MRC.

The previous two sections assume a single receive antenna is used. This section addresses the MRC multiple receive antennae case. A simplified conceptual block diagram of a D-path receive diversity system is shown in FIG. 8 for a single subcarrier k(channel mode 801). In this example, $X_{k,n}$ was received through D independent pathways and the D received symbols $Y_{k,n}^{(0)}, Y_{k,n}^{(1)}, \ldots Y_{k,n}^{(D-1)}$ are to be demodulated and decoded. In Maximum Ratio Combining (MRC), the received symbols are co-phased to provide coherent voltage addition and are individually weighted to provide optimal SNR. Assuming that perfect channel knowledge is available at the receiver, each receiver chain has the same average noise power $\sigma^2$, and the channel is flat-fading, the optimal MRC output generated by the MRC combine FEQ and demodulation unit 810, is given by $$\overline{X}_{k,n} = \frac{\sum_{d=0}^{D-1} H_{k,n}^{(d)*} Y_{k,n}^{(d)}}{\sum_{d=0}^{D-1} |H_{k,n}^{(d)}|^2}. \quad (37)$$

$Y_{k,n}^{(d)} = H_{k,n}^{(d)} \cdot X_{k,n} + v_{k,n}^{(d)}$, Equation (37) may be rewritten as (38)

$$\overline{X}_{k,n} = X_{k,n} + \frac{\sum_{d=0}^{D-1} H_{k,n}^{(d)*} v_{k,n}^{(d)}}{\sum_{d=0}^{D-1} |H_{k,n}^{(d)}|^2} \quad (39)$$

This signal is demodulated, and the I and Q components, Re$\{\overline{X}_{k,n}\}$ and Im$\{\overline{X}_{k,n}\}$, are sent to the Viterbi decoder 830.

Similar to the one receive antenna case, after MRC, the expected noise power of the symbols sent to the Viterbi decoder will no longer be the same. To optimize the Viterbi decoder performance consistent with the present invention, CSI should be incorporated appropriately to normalize the noise power from symbol to symbol so that their expected noise power equal to $\sigma^2$. Referring to the derivation in the one receive antenna case (Equations 14 and 15), one can derive that for the MRC case, taking into consideration of CSI for Viterbi decoding, is $$\text{Denoting } \overline{X}_{k,n}^{CSI} = \frac{\sum_{d=0}^{D-1} H_{k,n}^{(d)*} Y_{k,n}^{(d)}}{\sqrt{\sum_{d=0}^{D-1} |H_{k,n}^{(d)}|^2}}. \quad (40)$$

$$\hat{H}_{k,n} = \sqrt{\sum_{d=0}^{D-1} |H_{k,n}^{(d)}|^2}; \quad (41)$$

and similar to the one receive antenna case, the branch metric computation handled by the branch metric computation unit 1032 of the Viterbi decoder 1030 can be expressed as:

$$BM_{k,n,i} = -2\overline{X}_{k,n,i}^{CSI} \cdot \hat{H}_{k,n} \cdot X + (\hat{H}_{k,n} \cdot X)^2 \text{ (MRC with CSI)}, \quad (42)$$

where $i \in \{0,1\}$, and $X \in \{\pm 1\}$ for QPSK, $X \in \{\pm 1, \pm 3\}$ for 16-QAM, and $X \in \{\pm 1, \pm 3, \pm 5, \pm 7\}$ for 64-QAM constellations. For QPSK, the relationship simplifies to $$BM_{k,n,i} = -\overline{X}_{k,n,i}^{CSI} \cdot \hat{H}_{k,n} \cdot X \text{ (MRC with CSI)}. \quad (43)$$

In accordance with the joint equalization and decoding techniques described above with reference to Section 1, to reduce the receiver complexity, the division operations in the demodulator can be eliminated by first co-phasing the received signals from the different antennae before adding their contributions together.

$$Z_{k,n} = \sum_{d=0}^{D-1} H_{k,n}^{(d)*} \cdot Y_{k,n}^{(d)} \quad (44)$$

and computing the branch metrics using, $$BM_{k,n,i} = -2Z_{k,n,i} \cdot X + \hat{H}_{k,n}^{4} \cdot X^2 \text{ (MRC with CSI)}, \quad (45)$$

where $i \in \{0,1\}$, and $X \in \{\pm 1\}$ for QPSK, $X \in \{\pm 1, \pm 3\}$ for 16-QAM, and $X \in \{1\pm 3, \pm 5, \pm 7\}$ for 64-QAM constellations. For QPSK, the branch metrics simplify to $$BM_{k,n,i} = -Z_{k,n,i} \cdot X \text{ for QPSK (MRC with CSI)}. \quad (46)$$

Figure 10:
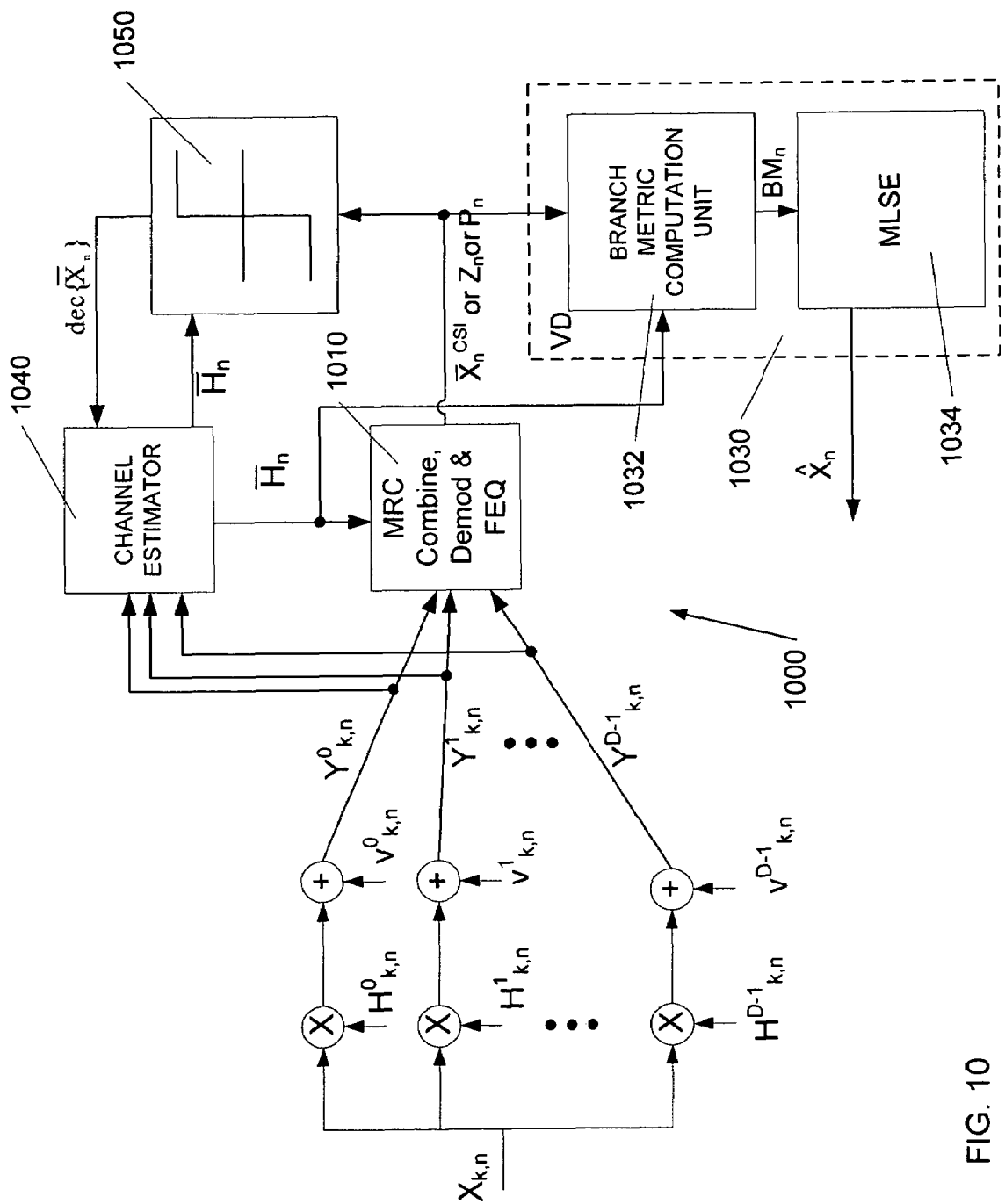
FIG. 10 is a simplified block diagram of an MRC receiver baseband processing unit according to another embodiment of the invention.

To further simplify the branch metric computation, the bit-by-bit piecewise approximation technique described above can be applied to compute the branch metrics for the branch computation unit 1032 of the Viterbi decoder 1030 (FIG. 10). In this case, the expressions to compute the branch metrics have the form, $$BM_{k,n,i} = -(|Z_{k,n,i}| - \hat{H}_{k,n}^{2} \cdot m) \cdot \text{sign}(b_i) \quad (47)$$

where m=0 for QPSK, m∈{0,2} for 16-QAM and m∈{0,2,4} for 64-QAM constellations, and $b_i \in \{\pm 1\}$.

In a practical MRC receiver design, the received signal in each receive pathway will pass through an Automatic Gain Control (AGC) (not shown) prior to frequency domain conversion through an individual pathway FFT (not shown) so that the dynamic range of the Analog-to-Digital Convertor (ADC) can be fully utilized. A simplified conceptual block diagram illustrating this feature is shown in FIG. A gain, denoted $g^{(d)}$ for branch or pathway d is applied to the received symbol $Y_{k,n}^{(d)}$ as noted in the channel model 901. Thus, the available received symbol at the receiver is, $$\tilde{Y}_{k,n}^{(d)} = g^{(d)} \cdot Y_{k,n}^{(d)}, \quad (48)$$

and the channel estimates can be expressed as:

$$\tilde{H}_{k,n}^{(d)} = g^{(d)} \cdot H_{k,n}^{(d)}, \quad (49)$$

Given that each receiver pathway is subjected to a different multipath channel, the gain can be different for each receiver pathway. In order to weight and normalize the MRC and the Viterbi decoder branch metrics properly, we substitute Equations 48 and 49 into Equation 40 to derive MRC with CSI, taking into consideration of the AGC gain in each receiver chain as follows:

$$\overline{X}_{k,n}^{CSI,AGC} = \frac{\sum_{d=0}^{D-1} (g^{(d)})^{-2} \tilde{H}_{k,n}^{(d)*} \tilde{Y}_{k,n}^{(d)}}{\sqrt{\sum_{d=0}^{(D-1)} (g^{(d)})^{-2} |\tilde{H}_{k,n}^{(d)}|^2}} \quad (50)$$

Similarly, the equivalent branch metrics in terms of $Y_{k,n}$ and $\overline{H}_{k,n}$ can be derived. For example, to implement the division-free demodulator within e.g. the MRC combine and demodulation unit 910 shown in the embodiment of FIG. 9, $$Z_{k,n} = \sum_{d=0}^{D-1} (g^{(d)})^{-2} \tilde{H}_{k,n}^{(d)*} \cdot \tilde{Y}_{k,n}^{(d)} \quad (51)$$

and the branch metric, using the bit-by-bit piecewise approximation approach discussed herein is, $$BM_{k,n,i} = (-|Z_{k,n,i}| + \check{H}_{k,n}^2 \cdot m)\mathrm{sign}(b_i) \text{ (MRC with CSI)} \quad (52)$$

where $$\overline{H}_{k,n} = \sqrt{\sum_{m=0}^{D-1} (g^{(m)})^{-2} |\tilde{H}_{k,n}^{(m)}|^2} \quad (53)$$

and where m=0 for QPSK, m∈{0,2} for 16-QAM and m∈{0, 2,4} for 64-QAM constellations, and $b_i \in \{\pm 1\}$.

For the case with 2 receive antennae, D=2, the demodulator using MRC is reduced to, $$Z_{k,n} = \tilde{H}_{k,n}^{(o)*} \cdot \tilde{Y}_{k,n}^{(0)} + \beta \cdot \tilde{H}_{k,n}^{(1)*} \cdot \tilde{Y}_{k,n}^{(1)} \quad (54)$$

and the branch metric, using the bit-by-bit piecewise approximation approach is, $$BM_{k,n,i} = (-|Z_{k,n,i}| + (\tilde{H}_{k,n}^{(0)2} + \beta \cdot \tilde{H}_{k,n}^{(1)2}) \cdot m) \cdot \mathrm{sign}(b_i) \text{ (MRC with CSI)} \quad (55)$$

where $$\beta = \left( \frac{g^{(0)}}{g^{(1)}} \right)^2 \quad (56)$$

Figure 9:
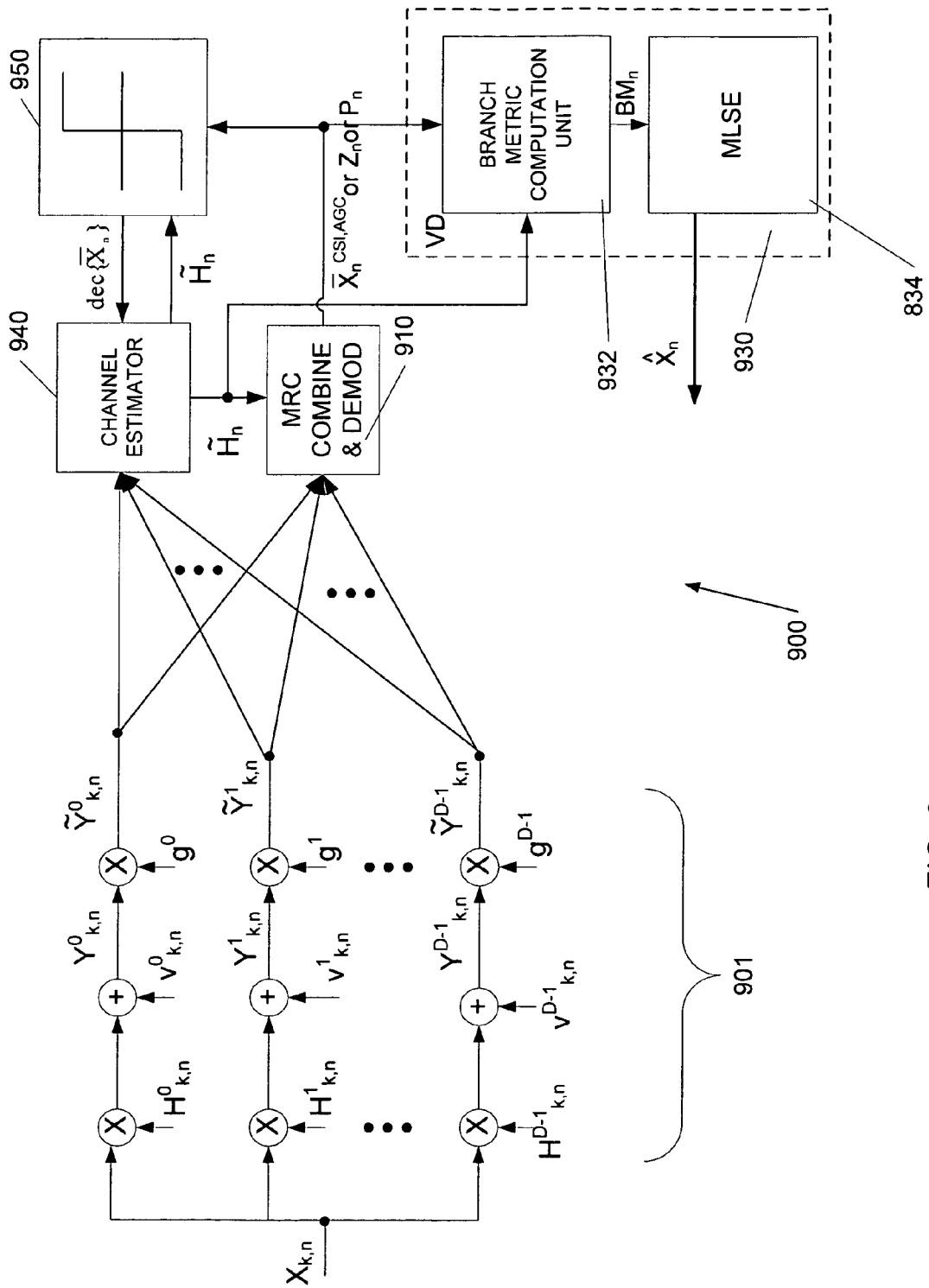
FIG. 9 is a simplified block diagram of a MRC receiver baseband processing unit including AGC adjustment according to an embodiment of the invention.

These practical receiver branch metric calculations may be conveniently undertaken in the branch metric computation unit 932 of the Viterbi decoder 930 as part of the MRC capable receiver baseband processing unit 900 shown in FIG. 9. If utilized, simulation results show at least a 1 dB SNR improvement.

In the above derivations, we assume that the gain for each receiver pathway or chain is a constant for each chain. This is true for an OFDM system where all the sub-carriers are subjected to same gain. Furthermore, in a quasi-static channel, the gain for each receiver chain throughout the packet burst remains constant. Therefore, when there is only one receive antenna, all the symbols are subjected to the same gain and therefore the gain factor can be ignored without affecting the decoder performance. For systems where this gain can change from symbol to symbol, the different gain factor for each symbol should be taken into consideration in the derivation of the demodulator and the branch metric computation, even for the single receive antenna case. The derivation is similar to that of the case with multiple antennae.

Figure 1:
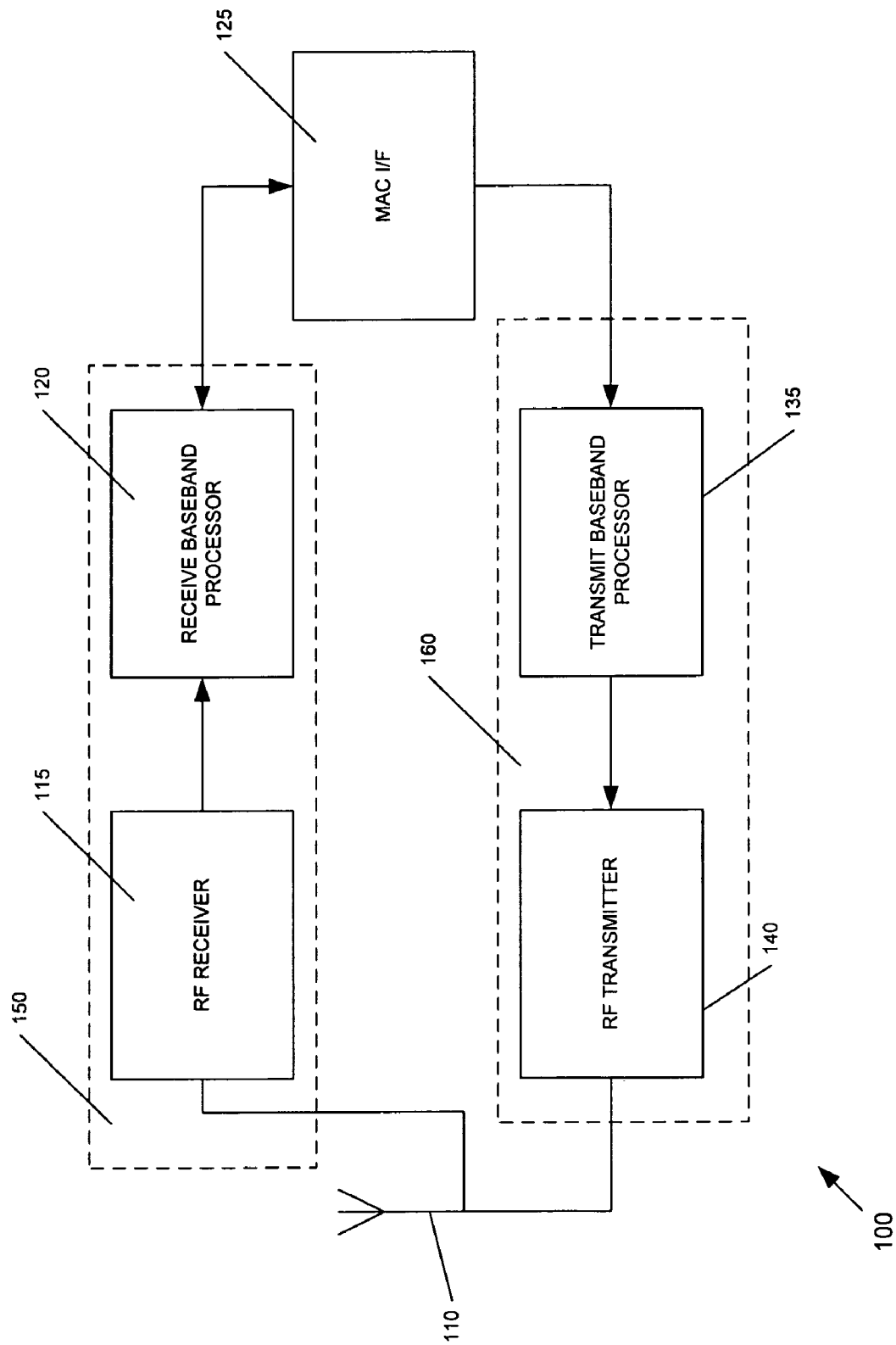
FIG. 1 is a simplified block diagram of a transceiver capable of implementing one or more features of the present invention.

Turning briefly to FIG. 1, FIG. 1 illustrates a wireless communications transceiver 100 capable of implementing the receiver baseband processing units shown in FIG. 3 or 4. In this embodiment, inbound RF signals conveying a 802.11a/g or 802.16a compliant frame of OFDM encoded symbols are picked up by the duplex antenna 110 and routed to the RF receiver unit 115 of a receiver 150 arranged in a manner consistent with the present invention. The RF receiver unit 115 performs routine downconversion and automatic gain control of the inbound RF signals, and presents an analog baseband signal containing the aforementioned 802.11a/g or 802.16a frame of OFDM symbols to the receive baseband processor 120, which can conveniently comprise the receiver baseband processing unit 300, 400 described above. Generally speaking, the receive baseband processor 120 performs symbol demodulation of the each inbound 802.11a/g or 802.16a compliant frame to recover bitstream data for receiver synchronization (preamble), frame or packet definition (header), or the actual inbound data of interest (payload). Consistent with the present invention, this processor 120 may include either units 300 or 400 to carry out joint decoding and equalization or reduced complexity decoding as described above.

Once recovered by the receive baseband processor 120, the inbound data contained in each received 802.11a/g or 802.16a formatted frame is delivered to a network interface such as the MAC layer interface 125 and then on to higher layer applications and devices being serviced by the transceiver 100. Outbound data intended for wireless transmission originating from the device(s) or application(s) being serviced by the transceiver 100 are delivered to the transmit baseband processor 135 of the transmitter 160 from the MAC interface 125. The transmit baseband processor 135 formulates appropriate 802.11a/g or 802.16a frame preamble and header information, and OFDM symbol encodes the outbound data to generate one or more complete outbound 802.11a/g or 802.16a frames. As the frame or packet is being developed, it is converted into analog form suitable for upconversion and RF transmission by the RF transmitter unit 140 consistent with 802.11a/g or 802.16a physical layer requirements.

Though only a single duplex antenna arrangement is shown in FIG. 1, the transceiver 100 can be easily adapted to incorporate multiple receive pathways or chains to take advantage of selection diversity or MRC diversity techniques as discussed above. To illustrate, consider the transceiver 101 in FIG. 11 which includes plural receive antenna (e.g. antennae 114, 111, and 112) respectively coupled to individual receive pathway RF receivers (.e.g 115, 116 and 117) as part of the receiver 151. In turn, the individual baseband signals recovered by these distinct receive pathway RF receivers are fed to a common receive baseband processor 121, which can conveniently implement an MRC aware receive baseband processing unit 1000 or 900 shown in FIGS. 10 and 9 respectively. A separate antenna 113 is shown in FIG. 11 to radiate the RF signal generated by the transmitter 160, though other types of antennae configuration may be utilized, as is known in the art.

Figure 11:
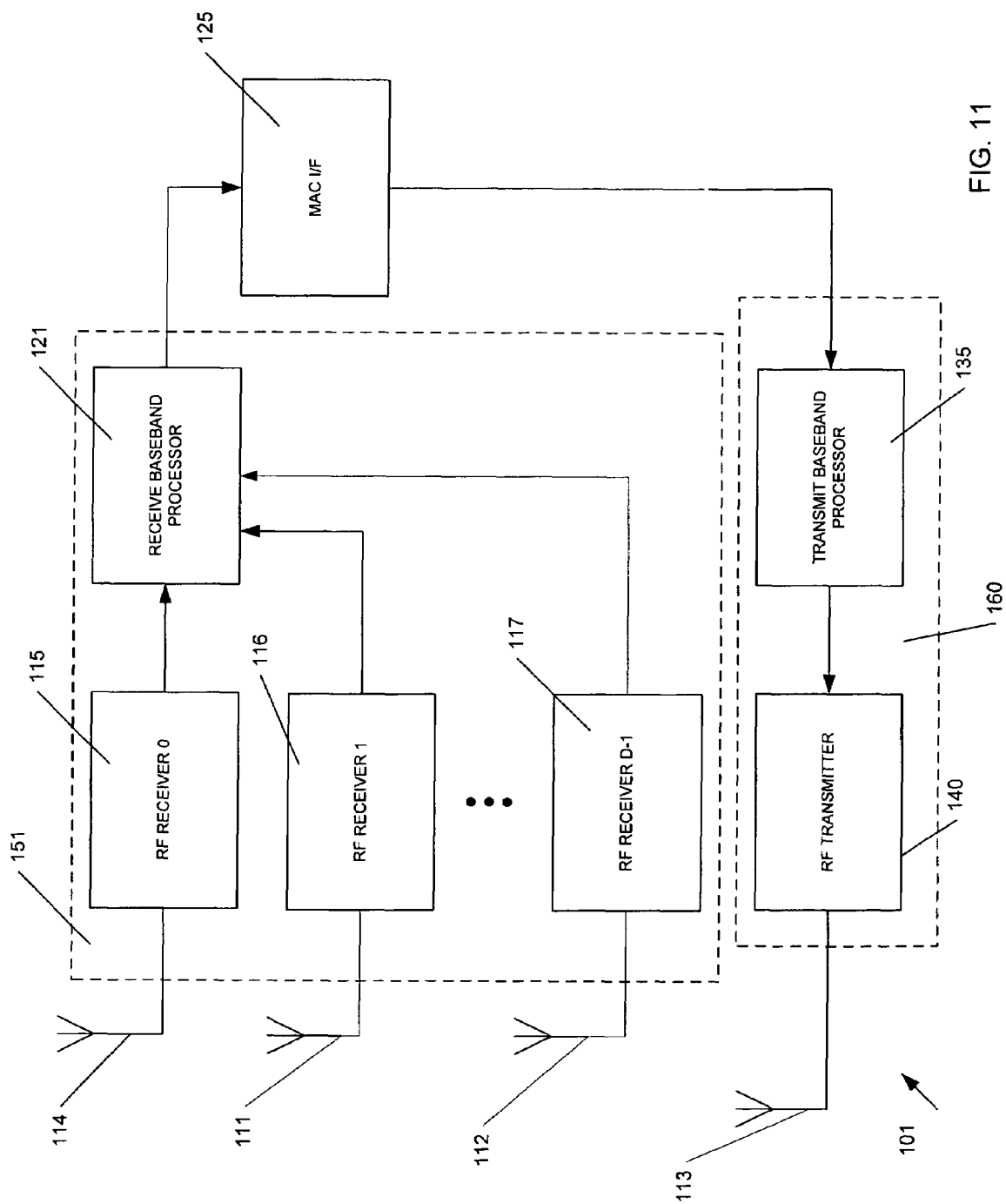
FIG. 11 is a simplified block diagram of a diversity reception compatible transceiver capable of implementing one or more features of the present invention.

Also, though not shown in FIG. 1 or 11, the transceiver 100, 101 may form an operational part of a network interface apparatus such as a PC card or network interface card capable of interfacing with the CPU or information processor of an information processing apparatus such as a desktop or laptop computer, and may be integrated within and constitute a part of such information processing apparatus. This network interface apparatus may alternatively form an operational component of a wireless communications access point such as a base station as will be appreciated by these ordinarily skilled in the art.

It will be obvious to those having skill in the art that many changes may be made to the details of the above-described embodiments of this invention without departing from the underlying principles thereof. For example, although the above-described embodiments deal with OFDM symbol decoding, the teachings of the invention are not intended to be so limiting, and in fact several aspects of the present invention may be applied to other types of receivers decoding orthogonal class symbol modulated data. To illustrate, joint equalization and decoding aspects of the invention may be easily applied to reducing pre-demodulation division operations in time domain applications, including adaptive complex gain normalization of the time domain signal to offset AGC side-effects when seeking to maximize the dynamic range of the ADC. The scope of the present invention should, therefore, be determined only by the following claims.

What is claimed is:

1. A receiver baseband processor, comprising:
a channel estimator that generates a channel estimate from a received symbol;
a phase demodulator that receives the channel estimate from the channel estimator and selectively rotates the phase of the received symbol; and
a decoder comprising:
a branch metric calculator that computes a plurality of branch metrics based on the channel estimate and selectively phase rotated received symbol; and
a most-likely symbol estimator that estimates a clean symbol based on the plurality of branch metrics.

2. The processor of claim 1 wherein said branch metric calculator computes the plurality of branch metrics using:

$$BM_{k,n,i} = -2Z_{k,n,i} \cdot |H_{k,n}|^2 \cdot X + (|H_{k,n}|^2 \cdot X)^2.$$

3. The processor of claim 1 wherein said branch metric calculator computes the plurality of branch metrics based on channel state information associated with the received symbol.

4. The processor of claim 3 wherein said branch metric calculator computes the plurality of branch metrics using:

$$BM_{k,n,i} = -2Z_{k,n,i} \cdot X + (|H_{k,n}| \cdot X)^2.$$

5. The processor of claim 1 wherein said branch metric calculator computes the plurality of branch metrics based on a piecewise bit-by-bit approximation.

6. The processor of claim 5 wherein said branch metric calculator computes the plurality of branch metrics using:

$$BM_{k,n,i} = -(|Z_{k,n,i}| - |H_{k,n}|^2 \cdot m) \cdot \text{sign}(b_i).$$

7. The processor of claim 1 wherein the received symbol comprises an OFDM symbol formatted in compliance with at least one of IEEE 802.11a, IEEE 802.11g, and IEEE 802.16a standards.

8. The processor of claim 7 wherein the OFDM symbol is mapped to one of a DBPSK, QPSK, 16-QAM, 64-QAM, a 256-QAM modulation constellation, and an N QAM modulation constellation wherein N exceeds 256.

9. A receiver baseband processor comprising:
a channel estimator that generates a channel estimate from the received symbol;
a phase demodulator that selectively rotates the phase of the received symbol;
a decoder comprising:
a branch metric calculator that computes a plurality of branch metrics based on the channel estimate and selectively phase rotated received symbol; and
a most-likely symbol estimator that estimates a clean symbol based on the plurality of branch metrics; and
a hard-decision slicer that generates a hard decision based thereon, wherein said channel estimator generates a subsequent channel estimate based on the hard decision.

10. A receiver baseband processor comprising:
a channel estimator that generates a channel estimate from the received symbol;
a phase demodulator that selectively rotates the phase of the received symbol; and
a decoder comprising:
a branch metric calculator that computes a plurality of branch metrics based on the channel estimate and selectively phase rotated received symbol; and
a most-likely symbol estimator that estimates a clean symbol based on the plurality of branch metrics,
wherein the channel estimate comprises a plurality of channel estimates; and
wherein said branch metric calculator applies a divisionless normalization factor that computes the plurality of branch metrics, wherein the divisionless normalization factor is based on a function of the magnitude of the plurality of channel estimates.

11. A transceiver, comprising:
an RF receiver that recovers a baseband signal, which includes a symbol bearing modulated data, wherein the symbol has a phase; and
a receiver baseband processor that decodes the symbol, comprising:
a channel estimator that generates a channel estimate from the symbol;
a phase demodulator that receives the channel estimate from the channel estimator and selectively rotates the phase of the received symbol; and
a decoder comprising:
a branch metric calculator that computes a plurality of branch metrics based on the channel estimate and selectively phase rotated symbol; and
a most-likely symbol estimator that estimates a clean symbol based on the plurality of branch metrics.

12. The transceiver of claim 11 wherein said branch metric calculator computes the plurality of branch metrics using:

$$BM_{k,n,i} = -2Z_{k,n,i} \cdot |H_{k,n}|^2 \cdot X + (|H_{k,n}|^2 \cdot X)^2.$$

13. The transceiver of claim 11 wherein said branch metric calculator computes the plurality of branch metrics based on channel state information associated with the symbol.

14. The transceiver of claim 13 wherein said branch metric calculator computes the plurality of branch metrics using:

$$BM_{k,n,i} = -2Z_{k,n,i} \cdot X + (|H_{k,n}| \cdot X)^2.$$

15. The transceiver of claim 11 wherein said branch metric calculator computes the plurality of branch metrics based on a piecewise bit-by-bit approximation.

16. The transceiver of claim 15 wherein said branch metric calculator computes the plurality of branch metrics using $$BM_{k,n,i} = -(|Z_{k,n,i}| - |H_{k,n}|^2 \cdot m) \cdot \text{sign}(b_i).$$

17. The transceiver of claim 11 wherein the symbol comprises an OFDM symbol formatted in compliance with at least one of IEEE 802.11a, IEEE 802.11g, and IEEE 802.16a standards.

18. The transceiver of claim 17 wherein the OFDM symbol is mapped to one of a DBPSK, QPSK, 16-QAM, 64-QAM, a 256-QAM modulation constellation, and an N QAM modulation constellation wherein N exceeds 256.

19. The transceiver of claim 11 further comprising a transmitter capable of transmitting an outbound signal.

20. A transceiver, comprising:
   an RF receiver that recovers a baseband signal, which includes a symbol bearing modulated data, wherein the symbol has a phase; and
   a receiver baseband processor that decodes the symbol, comprising:
      a channel estimator that generates a channel estimate from the symbol;
      a phase demodulator that selectively rotates the phase of the received symbol;
   a decoder comprising:
      a branch metric calculator that computes a plurality of branch metrics based on the channel estimate and selectively phase rotated symbol; and
      a most-likely symbol estimator that estimates a clean symbol based on the plurality of branch metrics; and
   a hard-decision slicer that performs a hard-decision operation based on the channel estimate and generate a hard decision based thereon, wherein said channel estimator that generates a subsequent channel estimate responsive to the hard decision.

21. A transceiver, comprising:
   an RF receiver that recovers a baseband signal, which includes a symbol bearing modulated data, wherein the symbol has a phase; and
   a receiver baseband processor for decoding the symbol, comprising:
      a channel estimator that generates a channel estimate from the symbol;
      a phase demodulator that selectively rotates the phase of the received symbol; and
   a decoder comprising:
      a branch metric calculator that computes a plurality of branch metrics based on the channel estimate and selectively phase rotated symbol; and
      a most-likely symbol estimator that estimates a clean symbol based on the plurality of branch metrics,
   wherein the channel estimate comprises a plurality of channel estimates; and
   wherein said branch metric calculator applies a divisionless normalization factor that computes the plurality of branch metrics, wherein the divisionless normalization factor is based on a function of the magnitude of the plurality of channel estimates.

22. A network interface apparatus, comprising:
   a wireless transceiver comprising:
      an RF receiver that recovers a baseband signal, which includes a symbol bearing modulated data, wherein the symbol has a phase;
      a receiver baseband processor that decodes the symbol comprising:
         a channel estimator that generates a channel estimate from the symbol;
         a phase demodulator that receives the channel estimate from the channel estimator and selectively rotates the phase of the symbol; and
         a decoder comprising:
            a branch metric calculator that computes a plurality of branch metrics based on the channel estimate and selectively phase rotated symbol; and
            a most-likely symbol estimator that estimates a clean symbol based on the plurality of branch metrics; and
      a network interface capable of recovering inbound data from the clean symbol.

23. A method comprising:
   generating a channel estimate from the symbol;
   receiving the channel estimate and selectively rotating the phase of the symbol at a phase demodulator;
   computing an equalized plurality of branch metrics based on the channel estimate and selectively phase rotated symbol; and
   estimating a clean symbol based on the plurality of branch metrics.

24. The method of claim 23 wherein said computing step includes computing the plurality of branch metrics using:

$$BM_{k,n,i} = -2Z_{k,n,i} \cdot |H_{k,n}|^2 \cdot X + (|H_{k,n}|^2 \cdot X)^2.$$

25. The method of claim 23 wherein said computing step includes computing the plurality of branch metrics based on channel state information associated with the symbol.

26. The method of claim 25 wherein said computing step includes computing the plurality of branch metrics using $$BM_{k,n,i} = -2Z_{k,n,i} \cdot X + (|H_{k,n}| \cdot X)^2.$$

27. A method for operating a receiver, the method comprising:
   generating a channel estimate from a symbol at the receiver;
   selectively rotating the phase of the symbol;
   computing an equalized plurality of branch metrics based on the channel estimate and selectively phase rotated symbol using a decoder;
   estimating a clean symbol based on the plurality of branch metrics;
   performing a hard-decision operation responsive to the channel estimate;
   generating a hard decision responsive to said performing step; and
   generating a subsequent channel estimate responsive to the hard decision.

28. The method of claim 27 wherein said computing step includes computing the plurality of branch metrics based on a piecewise bit-by-bit approximation.

29. The method of claim 28 wherein said computing step includes computing the plurality of branch metrics using:

$$BM_{k,n,i} = -(|Z_{k,n,i}| - |H_{k,n}|^2 \cdot m) \cdot \text{sign}(b_i).$$

30. A method for operating a receiver, the method comprising:
   generating a channel estimate from a symbol at the receiver;
   selectively rotating the phase of the symbol;
   computing a plurality of branch metrics based on the channel estimate and selectively phase rotated symbol using a decoder; and estimating a clean symbol based on the plurality of branch metrics, wherein the channel estimate comprises a plurality of channel estimates; and applying a divisionless normalization factor to the plurality of channel estimates prior to said branch metric computing step, wherein the divisionless normalization factor is based on a function of the magnitude of the plurality of channel estimates.

31. The method of claim 30 wherein the symbol comprises an OFDM symbol compliant with at least one of IEEE 802.11a, IEEE 802.11g, and IEEE 802.16a standards.

32. The method of claim 31 wherein the OFDM symbol is mapped to one of a DBPSK, QPSK, 16-QAM, 64-QAM, a 256-QAM modulation constellation, and an N QAM modulation constellation wherein N exceeds 256.

* * * * *